United States Patent
Yen et al.

(10) Patent No.: US 9,658,275 B2
(45) Date of Patent: *May 23, 2017

(54) DE-EMBEDDING ON-WAFER DEVICES

(71) Applicant: Taiwan Semiconductor Manufacturing Company, Ltd., Hsin-Chu (TW)

(72) Inventors: Hsiao-Tsung Yen, Tainan (TW); Chin-Wei Kuo, Hsinchu Country (TW); Ho-Hsiang Chen, Hsinchu (TW); Sa-Lly Liu, HsinChu (TW); Yu-Ling Lin, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/798,722

(22) Filed: Jul. 14, 2015

(65) Prior Publication Data
US 2015/0316603 A1    Nov. 5, 2015

Related U.S. Application Data

(63) Continuation of application No. 12/963,511, filed on Dec. 8, 2010, now Pat. No. 9,103,884.

(51) Int. Cl.
*G01R 31/00* (2006.01)
*G01R 31/26* (2014.01)
(Continued)

(52) U.S. Cl.
CPC ....... *G01R 31/2601* (2013.01); *G01R 1/0491* (2013.01); *G01R 31/2644* (2013.01);
(Continued)

(58) Field of Classification Search
CPC ............ G01R 31/318511; G01R 31/28; G01R 31/2822; G01R 31/2846; G01R 31/2884;
(Continued)

(56) References Cited

U.S. PATENT DOCUMENTS 5,439,848 A * 8/1995 Hsu ..................... H01L 23/5283
257/E21.575
6,100,589 A * 8/2000 Tanaka ................ H01L 23/5283
257/750
(Continued)

OTHER PUBLICATIONS

Volker Blaschke and James Victory, "Accurate Inductance De-Embedding Technique for Scalable Inductor Models" Microelectronic Test Structures, 2007. ICMTS '07. IEEE International Conference on Mar. 19-22, 2007.
(Continued)

*Primary Examiner* — Thang Le
(74) *Attorney, Agent, or Firm* — Haynes and Boone, LLP

(57) ABSTRACT

An apparatus includes three components. The first component includes a first transmission line; the second component is coupled with the first component and includes a second transmission line; and the third component electrically coupled with the first component and/or the second component. The transmission lines each include a substrate with a p-well or n-well within the substrate and a shielding layer over the p-well or n-well. The transmission lines also each include a plurality of intermediate conducting layers over the shielding layer, the plurality of intermediate conducting layers coupled by a plurality of vias. The transmission lines further each include a top conducting layer over the plurality of intermediate conducting layers.

18 Claims, 13 Drawing Sheets

(51) Int. Cl.
*G01R 1/04* (2006.01)
*G01R 31/3185* (2006.01)
*G11C 29/56* (2006.01)
*H01L 21/66* (2006.01)

(52) U.S. Cl.
CPC ...... *G01R 31/318511* (2013.01); *G11C 29/56* (2013.01); *H01L 22/34* (2013.01); *G11C 2029/5602* (2013.01)

(58) Field of Classification Search
CPC ........ G01R 31/02; G01R 31/26; G01R 31/27; H01L 22/34; H01L 2223/6622; H01L 2223/6627; H01L 2924/1903; H01L 2924/3011
USPC ............ 324/756.06, 756.01, 762.01, 762.05; 29/593, 592; 257/E21.531, 275, 630, 652
See application file for complete search history.

(56) References Cited

U.S. PATENT DOCUMENTS

| | | | | |
|---|---|---|---|---|
| 6,211,541 | B1* | 4/2001 | Carroll | H01L 23/66 257/275 |
| 6,492,716 | B1* | 12/2002 | Bothra | H01L 23/552 257/678 |
| 6,878,964 | B1* | 4/2005 | Lien | H01L 22/34 257/48 |
| 7,340,703 | B2* | 3/2008 | Hegazy | G01R 31/2853 257/E23.142 |
| 7,954,080 | B2 | 5/2011 | Yen et al. | |
| 2002/0179991 | A1* | 12/2002 | Varrot | H01L 24/03 257/459 |
| 2004/0195692 | A1* | 10/2004 | Adan | H01L 23/552 257/758 |
| 2009/0216480 | A1* | 8/2009 | Kuo | G01R 31/2822 702/118 |
| 2012/0146680 | A1 | 6/2012 | Yen et al. | |

OTHER PUBLICATIONS

Ming-Hsiang Cho, Guo-Wei Huang, Kun-Ming Chen, and An-Sam Peng, A Novel Cascade-Based De-Embedding Method for On-Wafer Microwave Characterization and Automatic Measurement, Microwave Symposium Digest, 2004 IEEE MTT-S International vol. 2, 6-11 Jun. 11, 2004 pp. 1237-1240 vol. 2.

Troels Emil Kolding, Ole Kiel Jensen, and Torben Larsen, "Ground-Shielded Measuring Technique for Accurate On-Wafer Characterization of RF CMOS Devices," Microelectronic Test Structures, 2000. ICMTS 2000.

Jyh-Chyurn Guo and Teng-Yang Tan, "A Broadband and Scalable Lumped Element Model for Fully Symmetric Inductors Under Single-Ended and Differentially Driven Operations," Electron Devices, IEEE Transactions on vol. 54, Issue 8, Aug. 2007.

* cited by examiner

DE-EMBEDDING ON-WAFER DEVICES

CROSS-REFERENCE TO RELATED APPLICATIONS

This is a continuation of U.S. Ser. No. 12/963,511 filed on Dec. 8, 2010, the full disclosure of which is incorporated by reference herein for all purposes. This is also related to U.S. application Ser. No. 12/042,606 filed Mar. 5, 2008, the full disclosure of which is incorporated by reference herein for all purposes.

BACKGROUND

Integrated circuits (ICs) formed on semiconductor substrates include multiple active and passive components, such as resistors, inductors, capacitors, transistors, amplifiers, etc. Such components are fabricated to a design specification that defines the ideal physical/electrical characteristics the component will exhibit (e.g., resistance, inductance, capacitance, gain, etc.). Though it is desirable to verify that each component fabricated complies with its specific design specification, typically, after integration into a circuit, an individual component cannot be readily tested. Thus, "stand-alone" copies of the individual IC components, components fabricated with the same process and with the same physical/electrical characteristics as the IC components, are fabricated on the wafer; and it is assumed that the physical/electrical properties measured for the "stand-alone" copies represent those of the non-tested individual IC components.

During testing, the "stand-alone" copy, referred to as the "device-under-test" (DUT), is electrically connected to leads and test pads, which are further connected to external testing equipment. Though the physical/electrical properties measured should accurately represent those of the DUT (and the individual IC component represented), the test pads and leads contribute physical/electrical characteristics, known as "parasitics" (e.g., resistance, capacitance, and inductance from the test pads and leads), that contribute to the measured characteristics of the DUT. The parasitics are factored out or extracted by a process known as "de-embedding" to reveal the intrinsic characteristics of the DUT alone.

Thus, accurate de-embedding methods are required to eliminate the parasitic contributions and accurately describe the intrinsic characteristics of the DUT (and ultimately, the individual IC component represented). Currently, on-wafer de-embedding methods referred to as "open-short," "open-thru," and "thru-reflect-line" ("TRL") have been widely used to subtract parasitics such as resistance, inductance, and capacitance arising from the test pads and leads at high frequencies (up to the GHz level). However, each of these methods presents problems: (1) the open-short method results in over de-embedding of the inductance parasitics from the lead metal lines; (2) the open-thru method accuracy depends on model fitting quality, often resulting in inaccurate parasitics extracted; (3) the TRL method requires at least three DUTs to cover a wide frequency range; and (4) all current methods use an approximate open pad. Furthermore, current metal routings have simply included a metal layer over a substrate, causing increased parasitic capacitance and lower characteristic impedance issues.

Accordingly, what is needed is a test structure and method for improving the accuracy of de-embedding parasitics.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
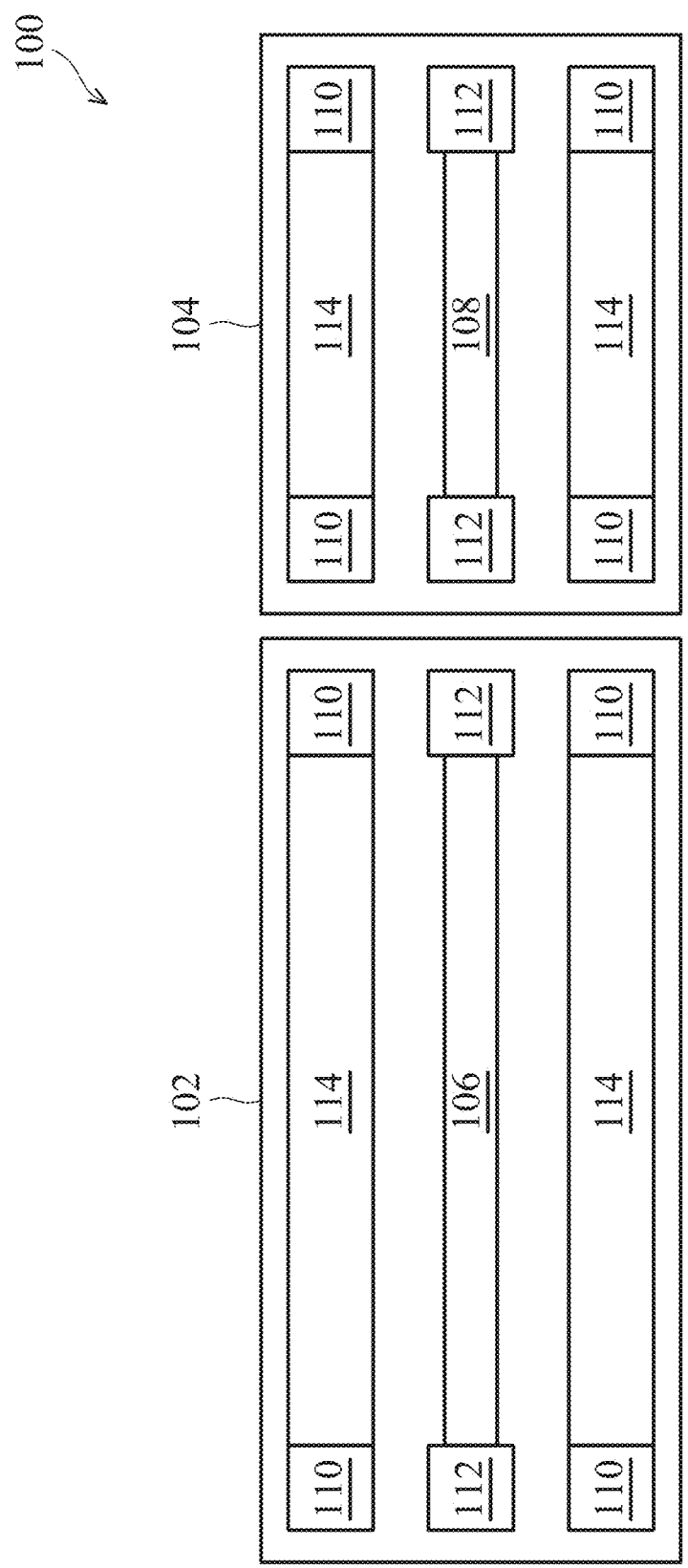
FIG. 1 is a block diagram of a test structure for de-embedding parasitics according to one embodiment of the present disclosure.

The present disclosure relates generally to the field of integrated circuits testing, and more particularly, to a system and method for de-embedding parasitics for on-wafer devices.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 through 4B, a test structure 100 and a method 400 for accurately de-embedding parasitics for on-wafer devices are collectively described below. It is understood that additional features can be added in the test structure 100, and some of the features described below can be replaced or eliminated, for additional embodiments of the test structure. It is further understood that additional steps can be provided before, during, and after the method 400 described below, and some of the steps described below can be replaced or eliminated, for additional embodiments of the method. The present embodiment of test structure 100 and method 400 significantly improves de-embedding accuracy of test structure parasitics, such as resistance, inductance, and capacitance.

Referring to FIG. 1, the test structure 100 comprises a first dummy component 102, a second dummy component 104, a first transmission line 106, a second transmission line 108, test pads 110 and 112, and connecting lines 114.

The first dummy component 102 is coupled with the second dummy component 104. The first dummy component 102 comprises the first transmission line 106. The second dummy component 104 comprises the second transmission line 108. In the present embodiment, the second transmission line 108 has length L and the first transmission line 106 has length 2 L (i.e., the first transmission line is two times longer than the second transmission line). The first and second transmission lines 106, 108 also comprise the same width and lie on or within the same semiconductor wafer. It is understood that the first dummy structure 106 may comprise the first transmission line 106 with length L, and the second dummy structure 108 may comprise the second transmission line 108 with length 2 L (i.e., the second transmission line is two times longer than the first transmission line). Further, in alternate embodiments, the first and second transmission lines 106, 108 may comprise varying widths.

In test structure 100, the first transmission line 106 and the second transmission line 108 are co-linear and may comprise any conducting material, such as aluminum, copper, aluminum-copper alloys, aluminum alloys, copper alloys, other metals, polysilicon, any other material, and/or combinations thereof. In alternate embodiments, the first and second transmission line may not be co-linear.

Both the first and second dummy components 102, 104 further comprise the test pads 110, 112 and connecting lines 114. In the preferred embodiment, the test pads 110 and 112 are implemented in a ground-signal-ground (GSG) test configuration; and the test pads 110 comprise ground test pads, and the test pads 112 comprise signal test pads. However, it is understood that, in alternate embodiments, the test structure 100 may comprise other testing configurations, such as ground-signal (GS), ground-signal-ground-signal-ground (GSGSG), and/or any other suitable testing configurations. The ground test pads 110 are electrically connected to one another via connecting lines 114. The signal test pads 112 are electrically connected via the first transmission line 106 and the second transmission line 108. Further, the test pads 110, 112 and connecting lines 114 may comprise any conducting material, such as aluminum, copper, aluminum-copper alloys, aluminum alloys, copper alloys, other metals, polysilicon, any other material, and/or combinations thereof. In alternate embodiments, the ground test pads 110 and signal test pads 112 may be electrically connected in other configurations, such as the ground test pads electrically connected via the first and second transmission lines, the signal test pads connected via connecting lines, and/or the ground and signal test pads electrically connected via the first and second transmission lines.

Figure 2:
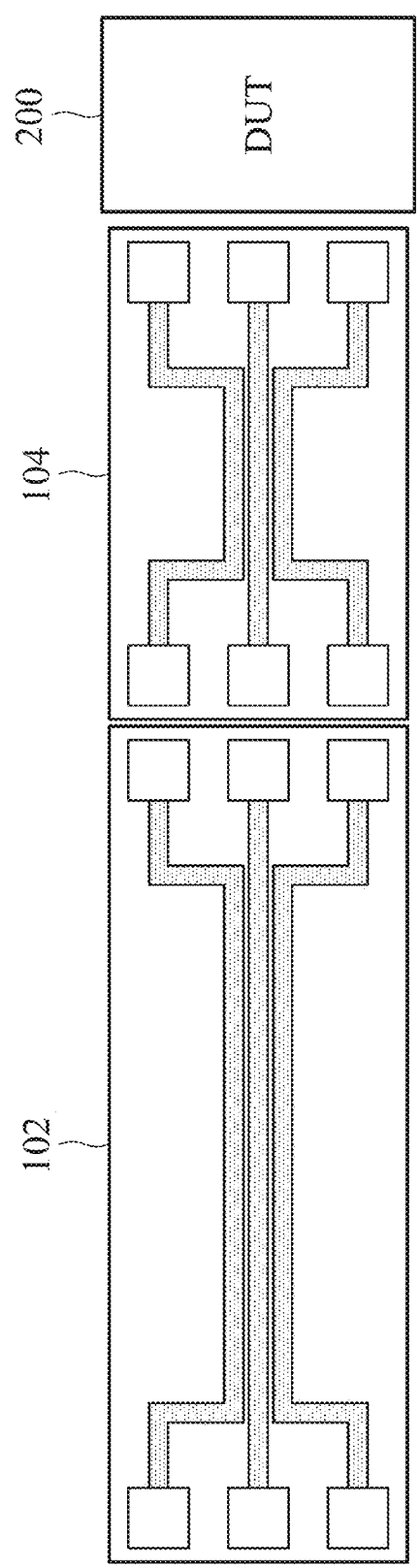
FIG. 2 is a top view of a test structure for de-embedding parasitics coupled with a device-under-test according to one embodiment of the present disclosure.

FIG. 2 provides a top view of the test structure 100 coupled with a device-under-test (DUT) 200. In FIG. 2, the first dummy component 102 couples with the second dummy component 104, and the second dummy component couples with the DUT 200. In the preferred embodiment, the test structure 100 is coupled with a co-planar wave guide (CPW). In alternate embodiments, the DUT 200 may be any other suitable DUT, such as a resistor, capacitor, diode, inductor, any other device on/in an integrated circuit, other co-planar wave guides, combinations thereof, and/or the integrated circuit itself. Further, as noted above, in alternate embodiments, the arrangement of the first dummy component 102 and second dummy component 104 may be reversed, where the first dummy component 102 (comprising the first transmission line 106 of length 2 L) may be coupled with the DUT 200 and then further coupled with the second dummy component 104 (comprising the second transmission line 108 of length L). In addition, though FIG. 2 shows the test structure 100 coupled with the DUT 200 in one location, in alternate embodiments, the test structure 100 may be coupled at multiple locations to the DUT 200. Also, in the present embodiment, only one test structure 100 couples with the DUT 200; however, in alternate embodiments, multiple test structures 100 may be coupled with the DUT 200.

The test structure 100 couples with the DUT 200 in order to determine the intrinsic characteristics of the DUT 200. In the present embodiment, during testing, the DUT 200 is coupled with the first dummy component 102 and the second dummy component 104, which are further connected to external testing equipment. Though the measured physical/electrical properties should accurately represent those of the DUT 200 alone, the test structure 100 contributes physical/electrical characteristics, known as "parasitics" (e.g., resistance, capacitance, and inductance from the transmission lines and test pads), that ultimately contribute to the measured characteristics of the DUT. In the present embodiment, the first and second transmission lines 106, 108 and signal test pads 112 of the first and second dummy components 102, 104 contribute parasitics to the measured characteristics of the DUT 200. In alternate embodiments, the ground test pads 110 and connecting lines 114 may also contribute parasitics to the overall measured physical/electrical characteristics of the DUT 200.

Figure 3:
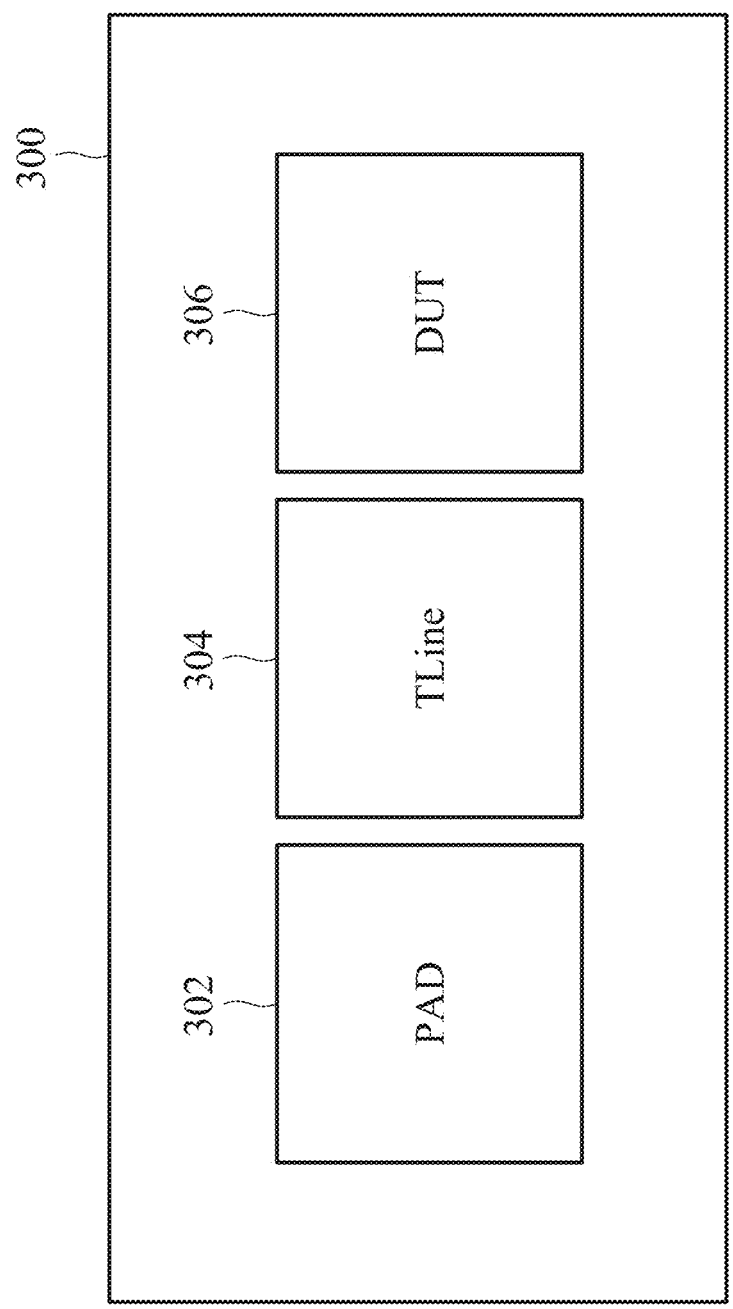
FIG. 3 is a block diagram of a test structure coupled with a device-under-test according to one embodiment of the present disclosure.

FIG. 3 provides a simple block diagram reflecting each portion that contributes physical/electrical characteristics to the measured characteristics of the DUT 200. Block 300 represents the measured characteristics of the DUT 200. The external measurements from the DUT 200 may include parasitics from the signal test pads 112, the first transmission line 106, and the second transmission line 108, and physical/electrical characteristics of the DUT 200. In FIG. 3, block 302 represents the parasitics contributed by the test pads 112; block 304 represents the parasitics contributed by the transmission lines 106, 108; and block 306 represents the intrinsic characteristics of the DUT 200. In alternate embodiments, block 302 may include parasitics contributed by test pads 110, and/or block 304 may include parasitics contributed by connecting lines 114. To obtain the intrinsic characteristics of the DUT 200 alone, the characteristics of block 306 alone, the contributions from blocks 302 and 304 must be factored out or extracted (i.e., de-embedded) from the measured characteristics of the DUT (block 300). In other words, the parasitics from the signal test pads 112, the first transmission line 106, and the second transmission line 108 must be de-embedded. It is understood that in alternate embodiments the parasitics from the ground test pads 110 and connecting lines 114 may also contribute to the measured electrical characteristics of the DUT 200 and may need to be de-embedded.

Figure 4A:
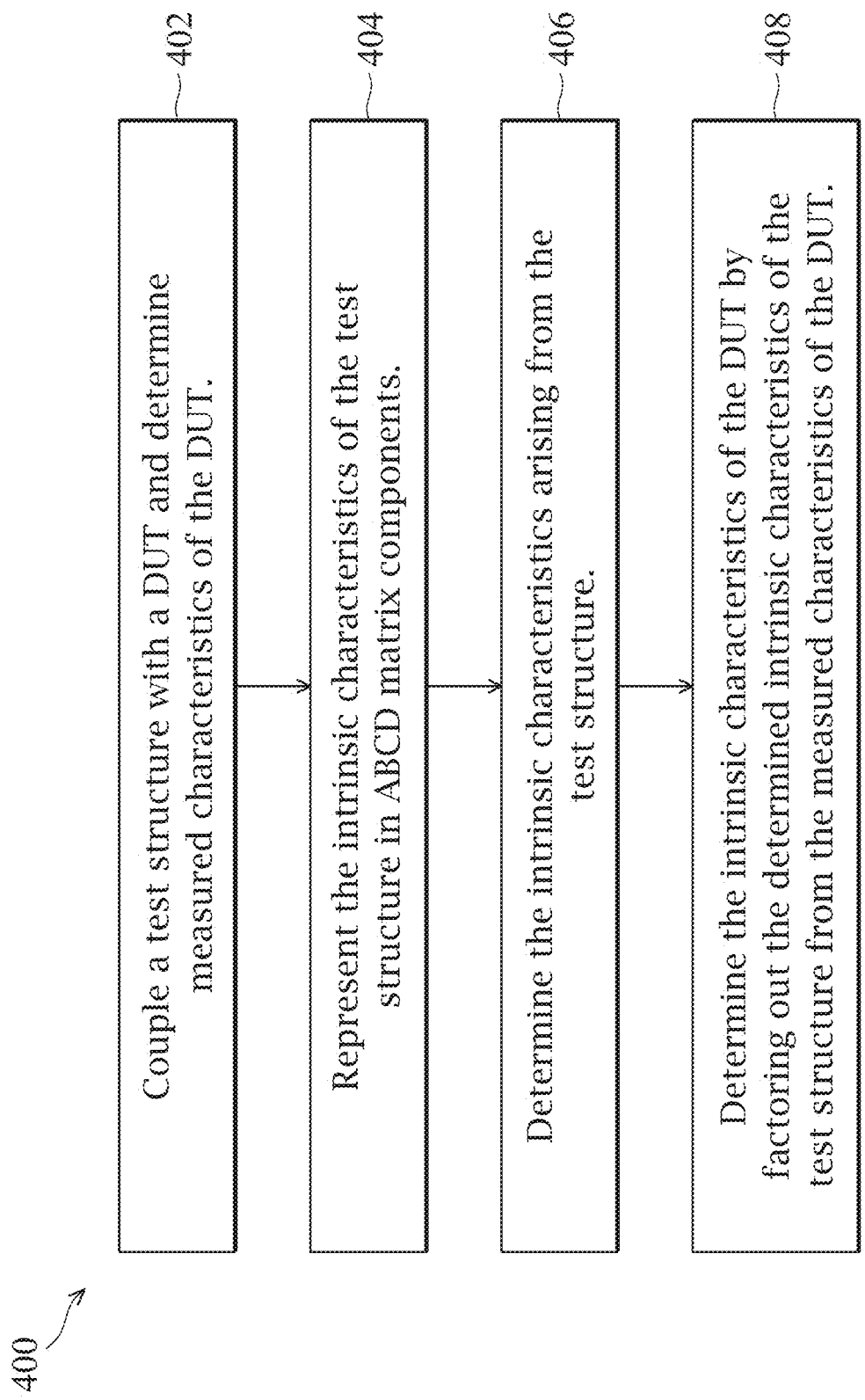
FIG. 4A is a flow chart of a method for de-embedding parasitics according to aspects of the present disclosure.

FIG. 4A is a flow diagram of one embodiment of a de-embedding process for accurately obtaining the intrinsic characteristics of the DUT 200 alone. In operation, the test structure 100 utilizes the method 400 to determine the intrinsic characteristics of the DUT 200 alone by de-embedding the parasitics (i.e., the resistance, capacitance, inductance, etc. arising from the test pads 110, 112 and transmission lines 106, 108).

Referring to FIGS. 1-4B, the method 400 begins with step 402, which involves coupling the test structure 100, comprising at least two dummy components 102, 104, at least two transmission lines 106, 108, and at least one test pad 110, 112, to the DUT 200. Once the test structure 100 is coupled with the DUT 200, the characteristics of the DUT 200 are measured. As noted above, parasitics from the test structure 100 contribute to the measured characteristics of the DUT 200. Accordingly, such parasitics contributed by the test structure 100 must be determined and extracted to obtain an accurate measurement for the intrinsic characteristics of the DUT 200.

In step 404, the intrinsic characteristics of the test structure are represented and decomposed into ABCD matrix components, which requires decomposing the parasitics contributed by the first dummy component 102 and second dummy component 104 into ABCD matrix components. The parasitics of the first dummy component 102, which comprises the first transmission line 106 of length 2 L, may be represented by [2 L]. The parasitics of the second dummy component 104, which comprises the second transmission line 108 of length L, may be represented by [L]. In alternate embodiments, the first dummy component 102 may comprise a transmission line of length L and be represented by [L], and the second dummy component 104 may comprise a transmission line of length 2 L and be represented by [2 L].

Figure 4B:
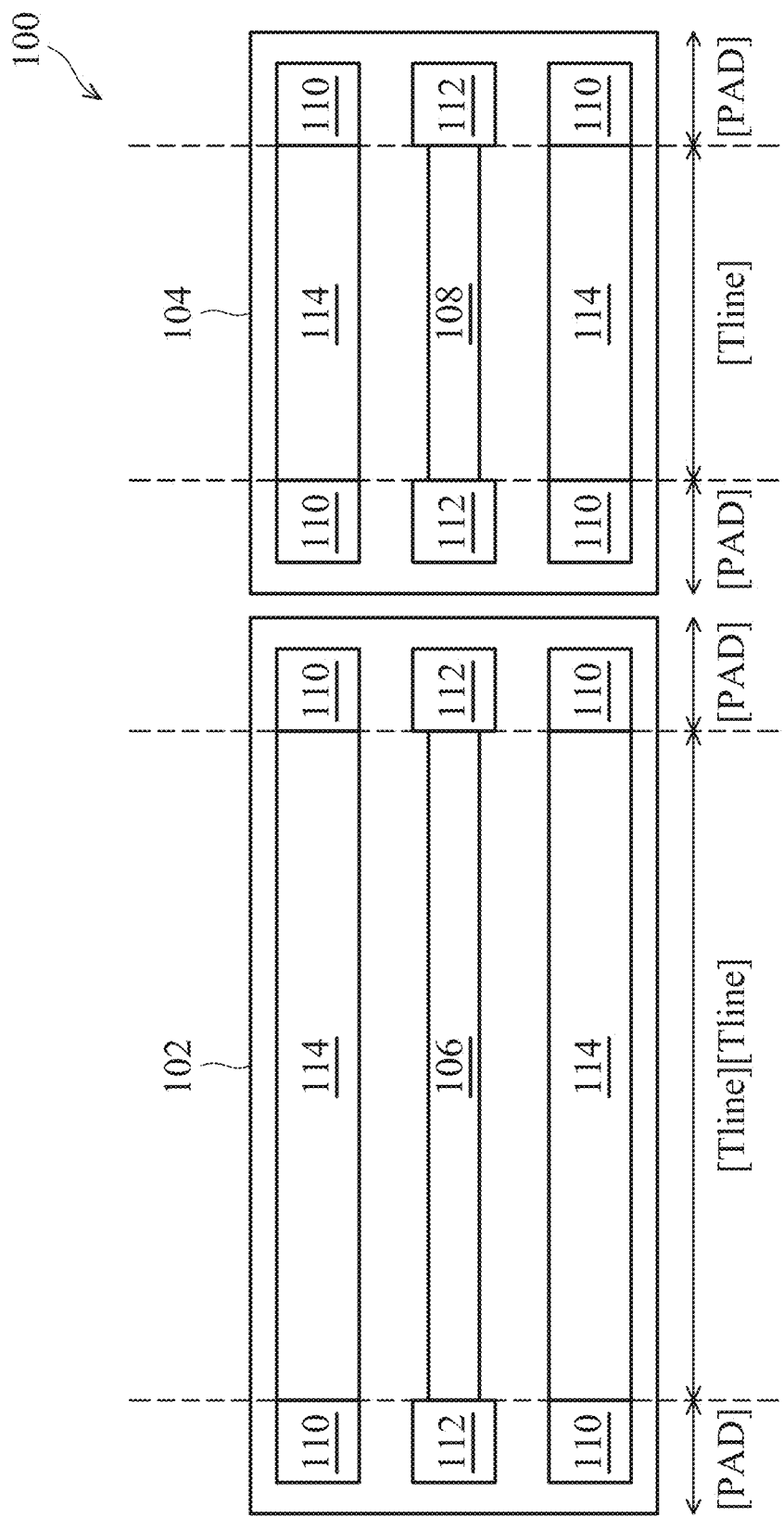
FIG. 4B is a block diagram of a test structure for de-embedding parasitics according to one embodiment of the present disclosure.

With reference to FIG. 4B, the test structure 100 is divided into separate portions that contribute to the overall parasitics arising from the first and second dummy components 102, 104. As noted above, the intrinsic characteristics of the test structure 100 arise from the signal test pads 112, the first transmission line 106, and the second transmission line 108, which must be factored out or extracted (i.e., de-embedded). In the present embodiment, the parasitics contributed by a single test pad are represented by the matrix [PAD], and the parasitics contributed by a transmission line of length L are represented by the matrix [TLine]. In alternate embodiments, [PAD] may represent parasitics contributed by multiple test pads, and [TLine] may represent parasitics contributed by multiple transmission lines of length L or a transmission line of a length other than L.

In the present embodiment, the parasitics contributed from the first and second dummy components 102, 104 arise from the first and second transmission lines 106, 108 and the signal test pads 112. So, with reference to FIG. 4B, the parasitics resulting from the second dummy component 104, [L], comprise the parasitics of the first signal test pad 112 ([PAD]), the second transmission line 108 of length L ([TLine]), and the second signal test pad 112 ([PAD]); and the parasitics resulting from the first dummy component 102, [2 L], comprise the parasitics of the first signal test pad 112 ([PAD]), the first transmission line 106 of length 2 L ([TLine][TLine]), and the second signal test pad 112 ([PAD]). It is understood that, in alternate embodiments, parasitics may arise from the ground test pads 110 and connecting lines 114 and may similarly be represented by matrices [PAD] or [TLine]. Thus, when the first and second dummy components 102, 104 are decomposed into ABCD matrix components, the following formulas represent the contributed parasitics:

$$[L]=[PAD][TLine][PAD]; \text{ and} \quad (1)$$

$$[2L]=[PAD][TLine][TLine][PAD], \quad (2)$$

where [PAD] is a matrix in ABCD matrix components representing the parasitics contributed by one test pad and [TLine] is a matrix in ABCD matrix components representing the parasitics contributed by a transmission line of length L.

In step 406, the intrinsic characteristics of the test structure, the parasitics, are determined. By manipulating equations (1) and (2) above, [PAD] and [TLine] may be solved for and represented by the following equations:

$$[PAD][PAD]=[[L]^{-1}[2L]/[L]^{-1}]^{-1} \quad (3)$$

$$[TLine]=[PAD]^{-1}[L][PAD]^{-1} \quad (4)$$

From equation (3), [PAD] is easily calculated by plugging in measurable data. Then, [TLine] is determined. When equations (3) and (4) are solved, all parasitics of the test structure 100 contributing to the measured characteristics of the DUT 200 (measured in step 402) are known.

In step 408, the intrinsic characteristics of the DUT are determined. This may be accomplished by factoring out or extracting the intrinsic characteristics of the test structure 100, determined in step 406, from the measured characteristics of the DUT 200 that were determined in step 402. For example, with reference to FIG. 3, blocks 302 and 304, the parasitics contributed by the test pads and transmission lines of the test structure 100, are extracted from block 300, the measured characteristics of the DUT 200, to obtain block 306, the intrinsic characteristics of the DUT 200 alone.

Figure 5A:
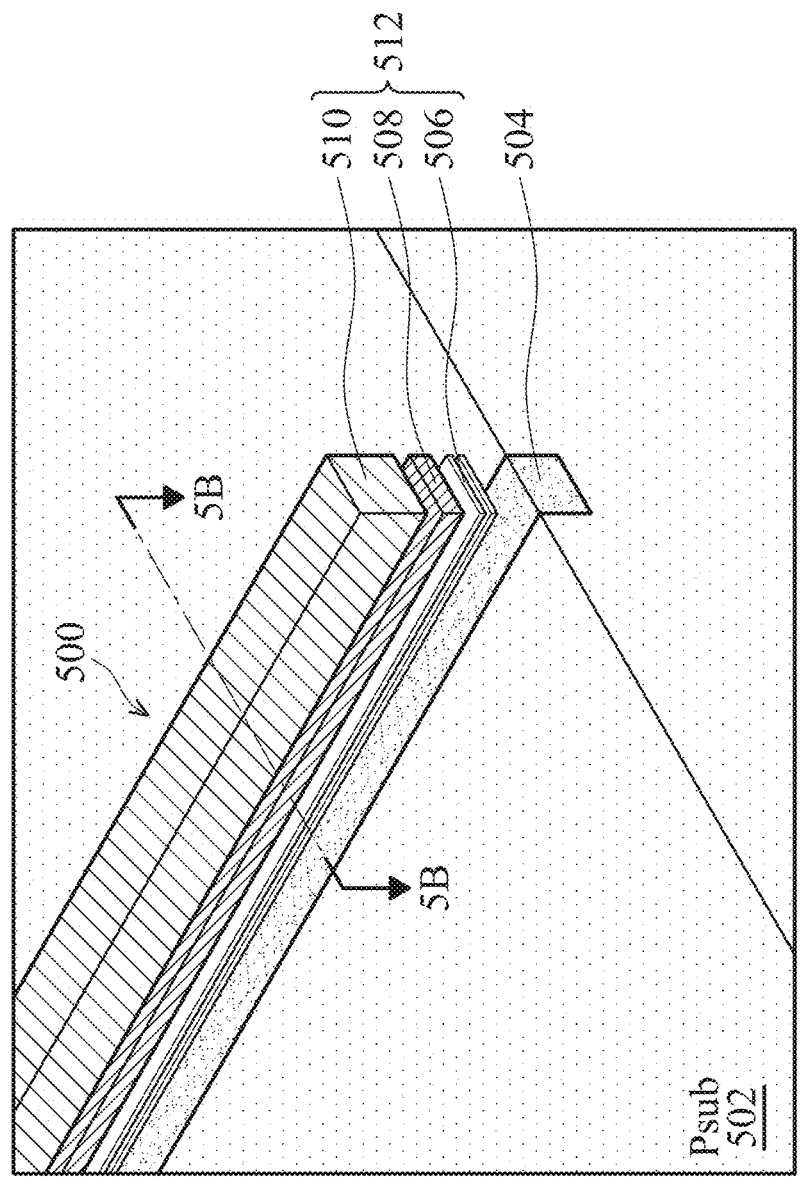
FIGS. 5A, 5B, 5C and 5D illustrate a perspective view, a cross-sectional view, a top view, and a side view, respectively, of a transmission line of a test structure according to one embodiment of the present disclosure.
Figure 5B:
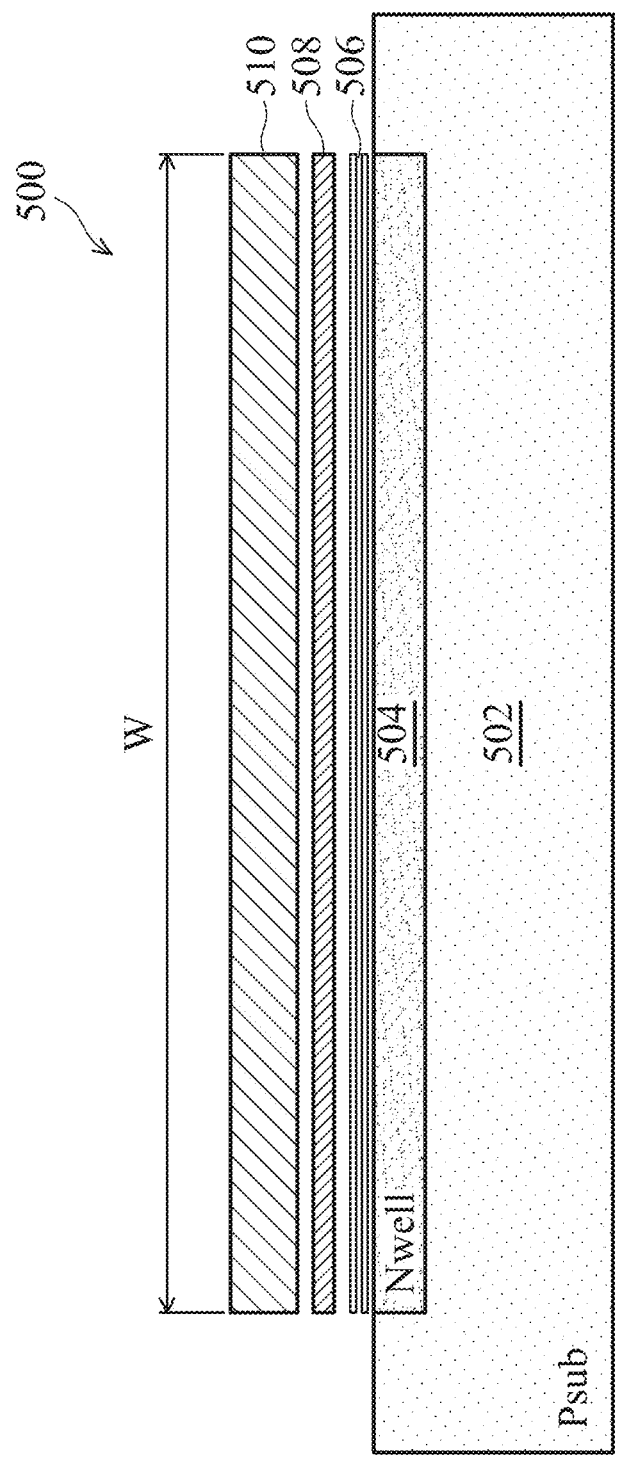

Referring now to FIGS. 5A, 5B, 5C, and 5D, a perspective view, a cross-sectional view, a top view, and a side view, respectively, of a transmission line 500 (e.g., applicable to first and second transmission lines 106, 108 of FIGS. 1 and 4B) is illustrated. FIG. 5B is a cross-sectional view of transmission line 500 along line 5B-5B in FIG. 5A. In one embodiment, transmission line 500 is electrically coupled to at least one testing pad (e.g., testing pads 112 of FIGS. 1 and 4B) in a testing structure (e.g., testing structure 100 of FIGS. 1 and 4B). In another embodiment, transmission line 500 is electrically coupled to at least one testing pad (e.g., testing pads 112 of FIGS. 1 and 4B) at both ends of the transmission line 500.

In accordance with one embodiment of the present disclosure, transmission line 500 comprises a substrate 502 (e.g., a p-type doped substrate), a doped well 504 (e.g., a n-well) within the substrate 502, a shielding layer 506 over the doped well 504, an intermediate metal layer 508 (e.g., a plurality of intermediate metal layers coupled by a plurality of vias) over the shielding layer 506, and a top metal layer 510 over the intermediate metal layer 508.

In one example, substrate 502 is a semiconductor substrate and may be comprised of silicon, or alternatively may include silicon germanium, gallium arsenic, or other suitable semiconductor materials. The substrate may further include doped active regions and other features such as a buried layer, and/or an epitaxy layer. Furthermore, the substrate may be a semiconductor on insulator such as silicon on insulator (SOI). In other embodiments, the semiconductor substrate may include a doped epitaxy layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure. The active region may be configured as an NMOS device (e.g., nFET) or a PMOS device (e.g., pFET). The semiconductor substrate may include underlying layers, devices, junctions, and other features (not shown) formed during prior process steps or which may be formed during subsequent process steps.

In one example, substrate 502 is doped with a p-type dopant, and a n-well is formed within the substrate 502 as the doped well 504. Doped well 504 may be formed by doping substrate 502 with various n-type dopants, such as phosphorus, at a concentration between about 1E12 $cm^{-2}$ and about 1E13 $cm^{-2}$, in one example. In other embodiments, doped well 504 may be formed as a deep n-well (DNW), or a p-well. In yet other embodiments, doped well 504 may include polysilicon or a metal. Doped well 504 may have various widths and depths. In this embodiment, doped well 504 is formed to have substantially the same width W as overlying shielding layer 506 and the overlying metal layers 512, as shown by the cross-sectional view of transmission line 500 in FIG. 5B and the top view of transmission line 500 in FIG. 5C. Accordingly, the doped well 504 is substantially underlying the shielding layer 506 and metal layers 512 in one embodiment.

In one example, shielding layer 506 is comprised of a metal, such as aluminum (Al) or copper (Cu), and has a thickness between about 0.01 micron and about 1 micron. Shielding layer 506 may have various widths and thicknesses. In this embodiment, shielding layer 506 is formed to have substantially the same width W as underlying doped well 504 and the overlying metal layers 512, as shown by the cross-sectional view of transmission line 500 in FIG. 5B and the top view of transmission line 500 in FIG. 5C.

Figure 5C:
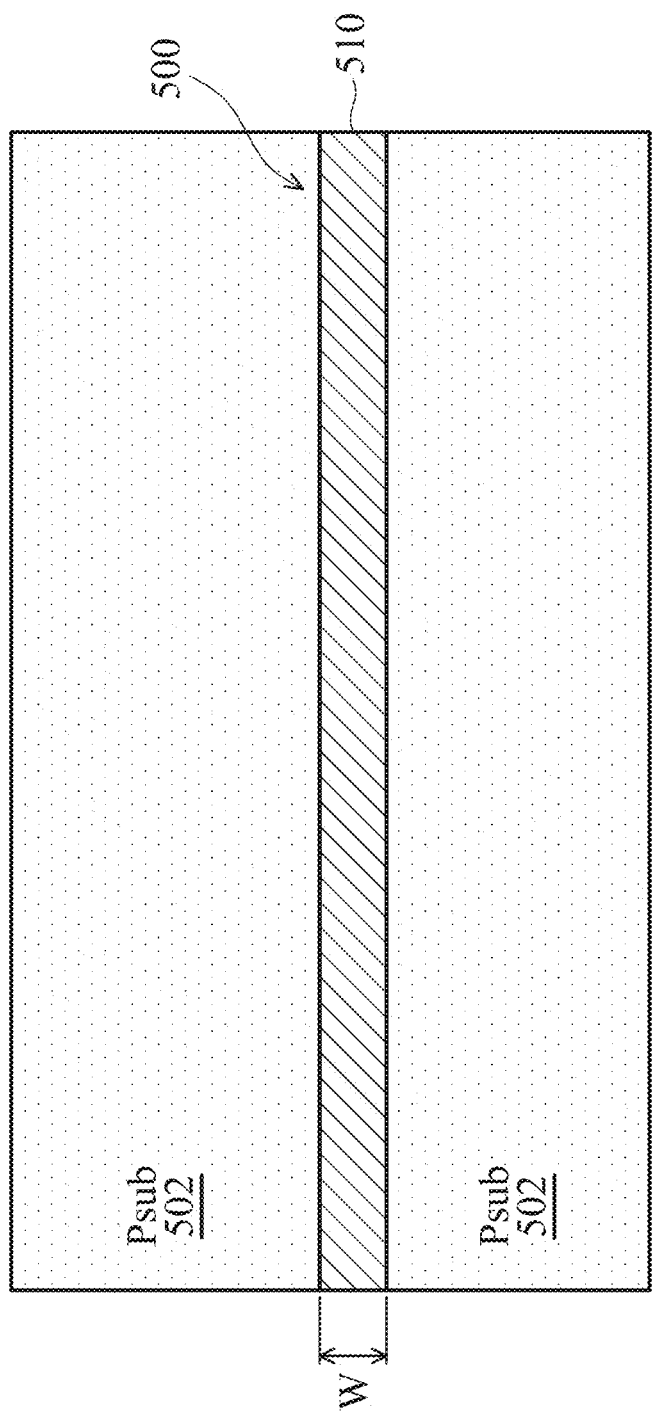
Figure 5D:
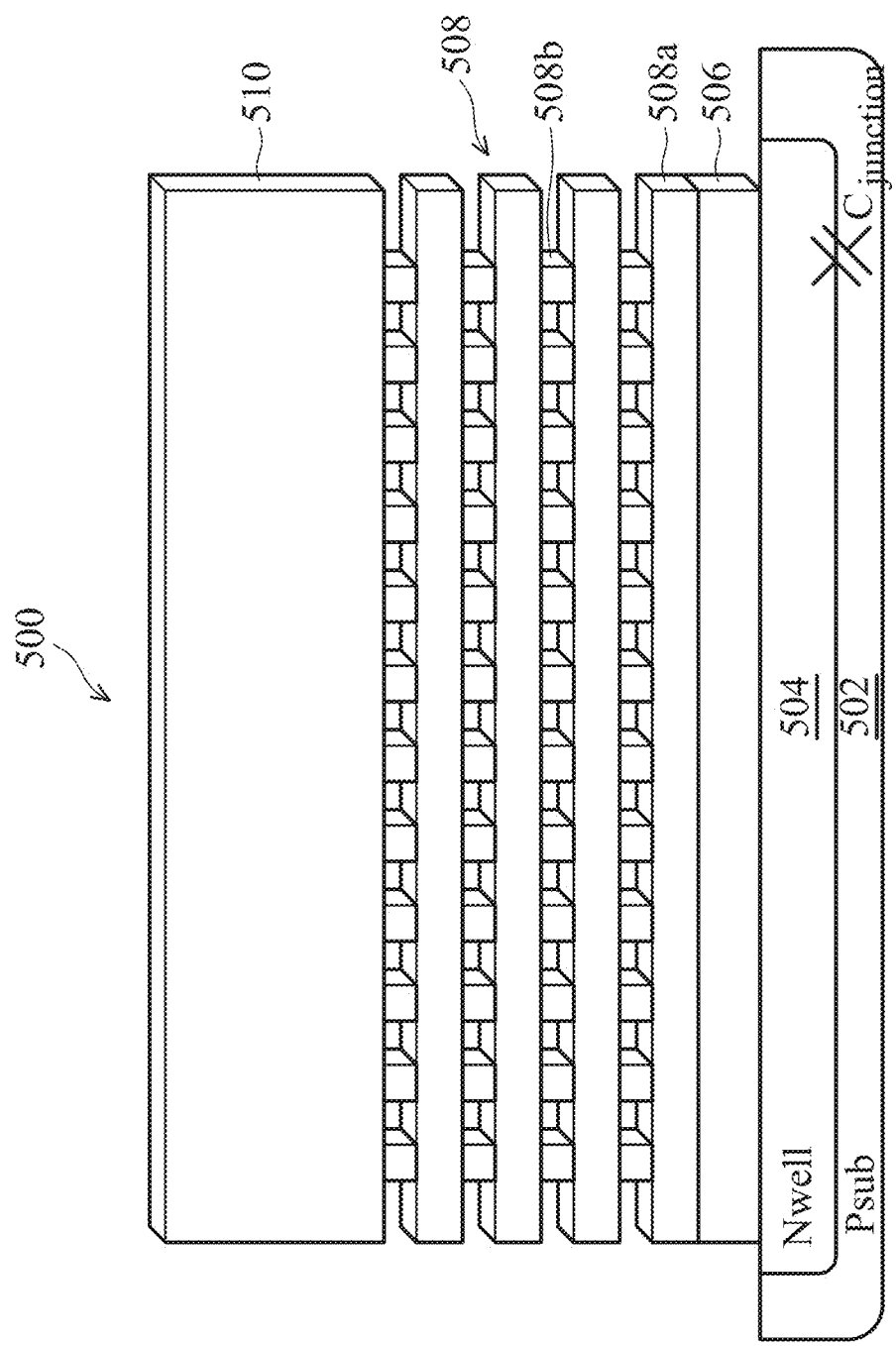

In one example, intermediate metal layer 508 may be comprised of a plurality of metal layers 508a coupled together by a plurality of vias 508b, as shown by the side view of transmission line 500 in FIG. 5D. Intermediate metal layer 508 may be comprised of various metals, such as aluminum (Al) or copper (Cu), and may have a thickness between about 0.01 micron and about 1 micron. Intermediate metal layer 508 may have various widths and thicknesses. Although four metal layers 508a are shown in FIG. 5D, the intermediate metal layer 508 is not limited to such a number, and more or less metal layers may comprise the intermediate metal layer. In this embodiment, intermediate metal layer 508 is formed to have substantially the same width W as underlying doped well 504, underlying shielding layer 506, and the overlying top metal layer 510, as shown by the cross-sectional view of transmission line 500 in FIG. 5B and the top view of transmission line 500 in FIG. 5C.

In one example, top metal layer 510 may be comprised of various metals, such as aluminum (Al) or copper (Cu), and may have a thickness between about 1 micron and about 5 micron. Top metal layer 510 may have various widths and thicknesses. In this embodiment, top metal layer 510 is formed to have substantially the same width W as underlying doped well 504, underlying shielding layer 506, and the underlying intermediate metal layer 508, as shown by the cross-sectional view of transmission line 500 in FIG. 5B and the top view of transmission line 500 in FIG. 5C.

In one example, conductive vias may couple shielding layer 506, intermediate metal layer 508, and top metal layer 510. In other words, vias may be positioned between the layers 506, 508, and 510. Dielectric layers, such as oxides, may be deposited between the transmission line layers (e.g., between layers 504, 506, 508, and 510), and/or the vias in one example.

As noted above, in accordance with one embodiment, the doped well 504, the shielding layer 506, the intermediate metal layer 508, and the top metal layer 510 have the same cross-sectional width W, as shown in the cross-sectional view of transmission line 500 in FIG. 5B and the top view of transmission line 500 in FIG. 5C. Width W may range between about 1 micron and about 6 micron in one example. Advantageously, the constant width of the doped well and the overly layers of the transmission line provide for reducing overall capacitance of the transmission line.

Figure 6A:
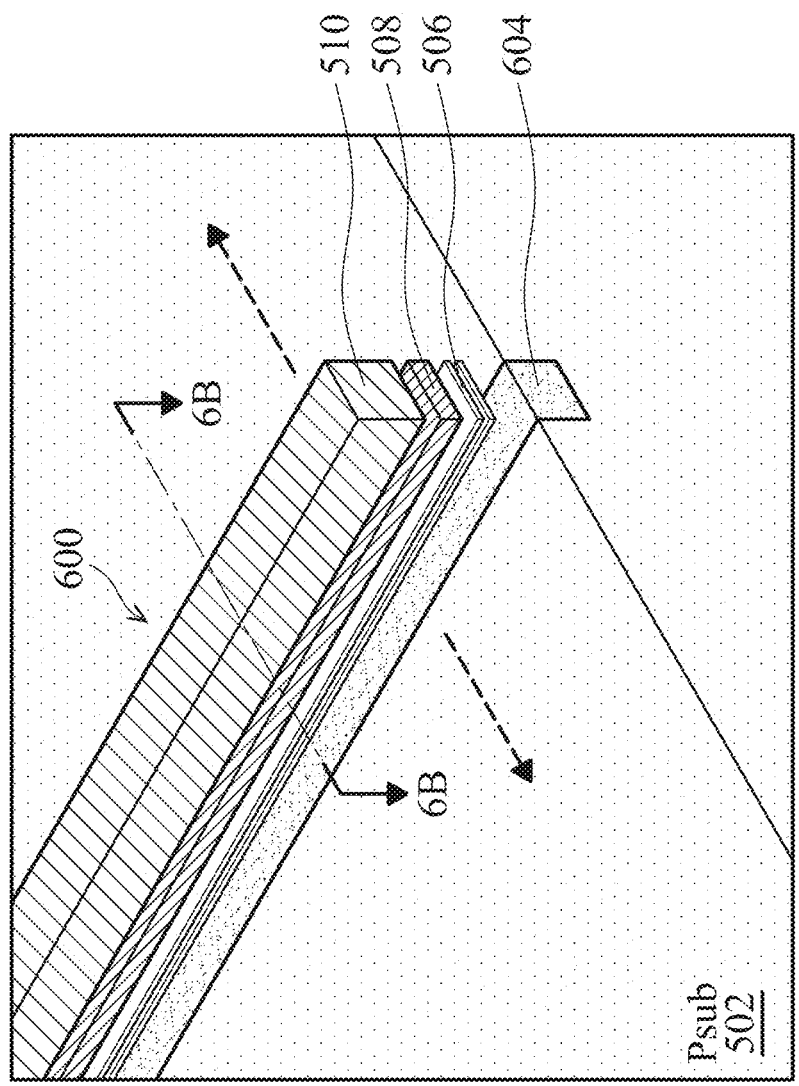
FIGS. 6A and 6B illustrate a perspective view and a cross-sectional view, respectively, of a transmission line of a test structure according to another embodiment of the present disclosure.
Figure 6B:
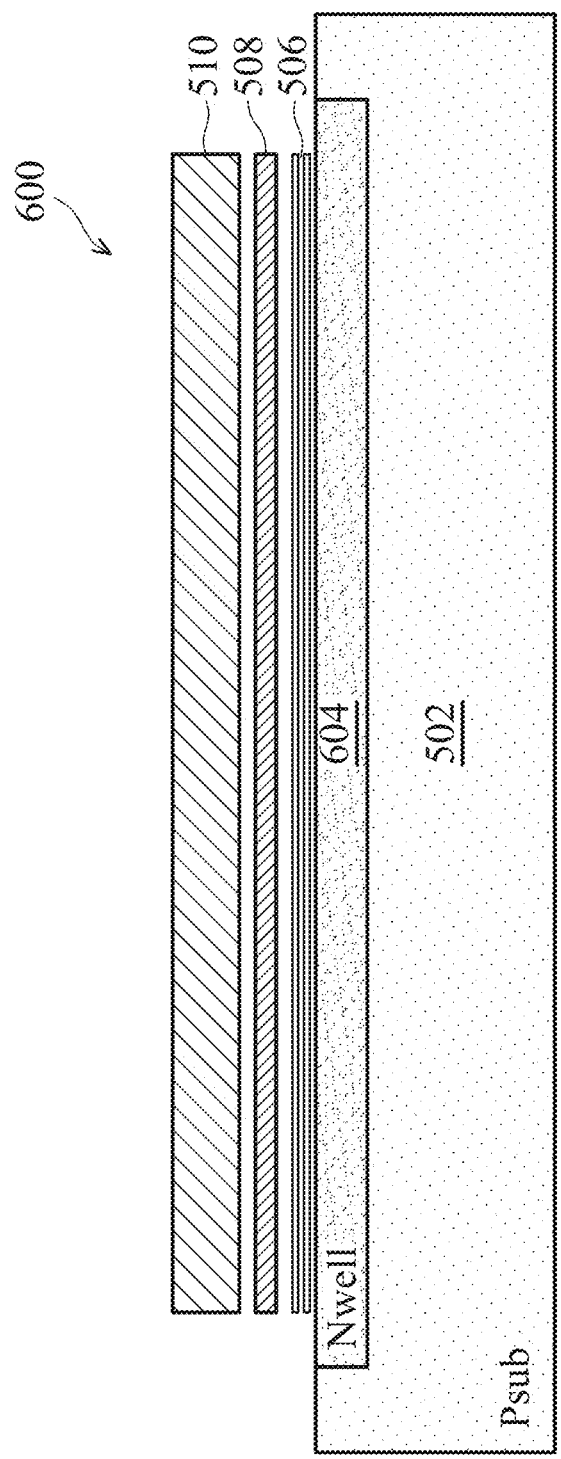

Referring now to FIGS. 6A and 6B, a perspective view and a cross-sectional view, respectively, of a transmission line 600 is illustrated according to another embodiment of the present disclosure. FIG. 6B is a cross-sectional view of transmission line 600 along line 6B-6B in FIG. 6A.

In accordance with one embodiment of the present disclosure, transmission line 600 comprises a substrate 502 (e.g., a p-type doped substrate), a doped well 604 (e.g., a n-well) within the substrate 502, a shielding layer 506 over the doped well 504, an intermediate metal layer 508 (e.g., a plurality of intermediate metal layers coupled by a plurality of vias) over the shielding layer 506, and a top metal layer 510 over the intermediate metal layer 508. Elements of transmission line 600 may include substantially similar elements as those described above with respect to transmission line 500, which are numbered similarly or the same. Prolix descriptions related to those substantially similar elements may not be repeated here although fully applicable in this embodiment.

In this embodiment, transmission line 600 includes a doped well 604 which has a greater width than the shielding layer 506, the intermediate metal layer 508, and the top metal layer 510, as shown by the opposing arrows in FIG. 6A depicting a wider doped well 604, and the cross-sectional view of transmission line 600 in FIG. 6B. In one example, shielding layer 506, intermediate metal layer 508, and top metal layer 510 may each have a width W and doped well 604 may have a width greater than W.

Figure 7A:
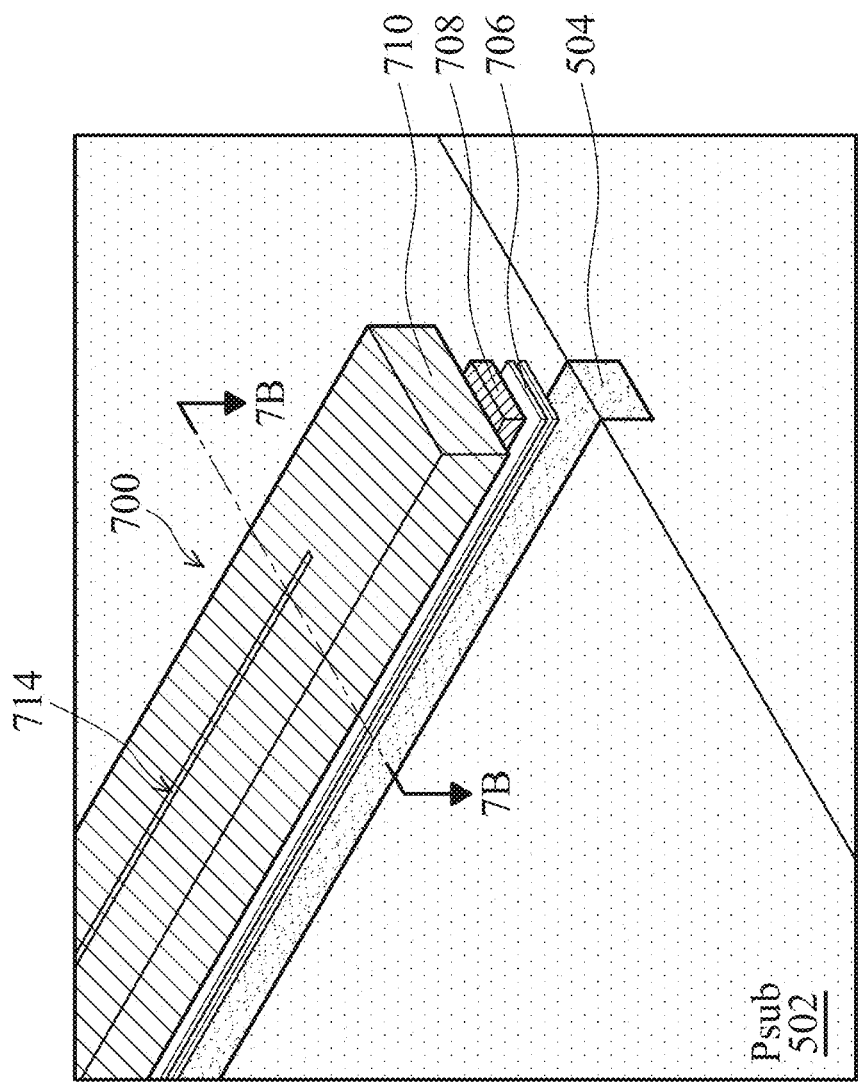
FIGS. 7A and 7B illustrate a perspective view and a cross-sectional view, respectively, of a transmission line of a test structure according to yet another embodiment of the present disclosure.
Figure 7B:
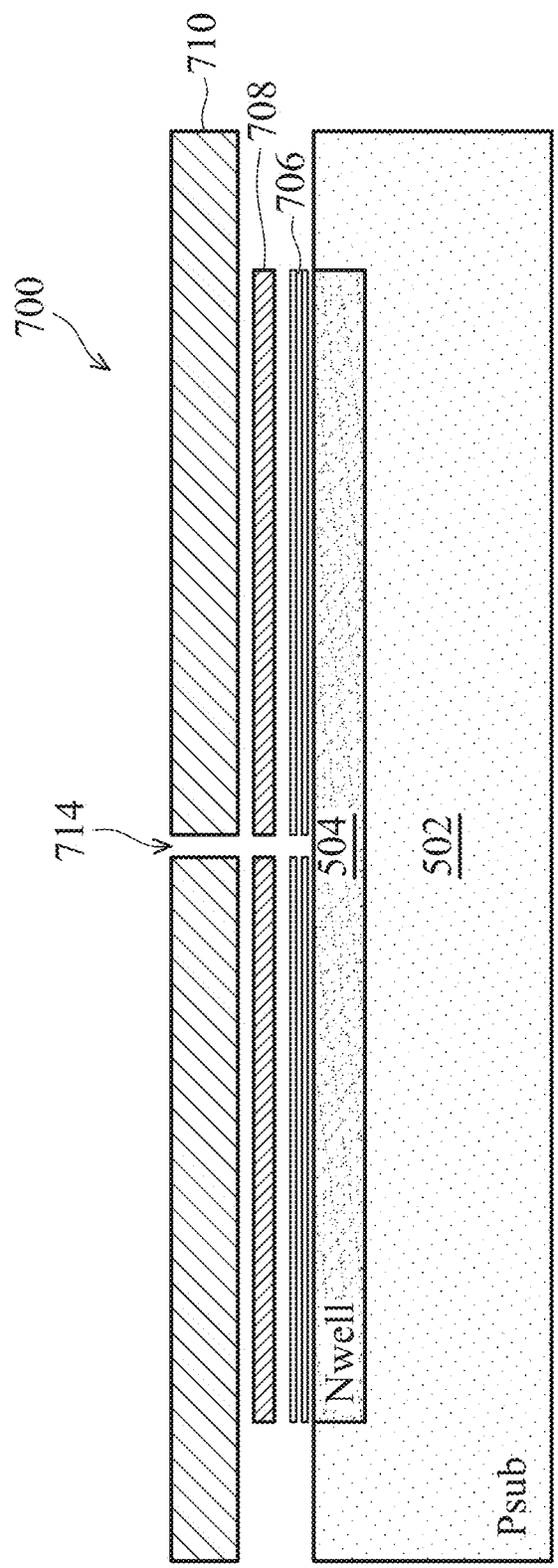

Referring now to FIGS. 7A and 7B, a perspective view and a cross-sectional view, respectively, of a transmission line 700 is illustrated according to another embodiment of the present disclosure. FIG. 7B is a cross-sectional view of transmission line 700 along line 7B-7B in FIG. 7A.

In accordance with one embodiment of the present disclosure, transmission line 700 comprises a substrate 502 (e.g., a p-type doped substrate), a doped well 504 (e.g., a n-well) within the substrate 502, a shielding layer 706 over the doped well 504, an intermediate metal layer 708 (e.g., a plurality of intermediate metal layers coupled by a plurality of vias) over the shielding layer 706, and a top metal layer 710 over the intermediate metal layer 708. A slot 714 is formed through shielding layer 706, intermediate metal layer 70, and top metal layer 710. Elements of transmission line 700 may include substantially similar elements as those described above with respect to transmission lines 500 and/or 600, which are numbered similarly or the same. Prolix descriptions related to those substantially similar elements may not be repeated here although fully applicable in this embodiment.

In this embodiment, transmission line 700 includes top metal layer 710 which has a greater width than the doped well 504, the shielding layer 706, and the intermediate metal layer 708, as shown by the perspective view of transmission line 700 in FIG. 7A and the cross-sectional view of transmission line 700 in FIG. 7B. In one example, doped well 504, shielding layer 706, and intermediate metal layer 708 may each have a width W and top metal layer 710 may have a width greater than W. In one example, the width of top metal layer 710 may be twice the width of doped well 504 and layers 706 and 708. In other words, top metal layer 710 may have a width 2W and shielding layer 706 and intermediate layer 708 may each have a width W. The width of the top metal layer 710 may be a design parameter for parasitic capacitance, and having a larger width than doped well 504, shielding layer 706, and intermediate metal layer 708 may reduce the parasitic inductance and resistance of the transmission line.

Also in this embodiment, transmission line 700 includes slot 714 through the shielding layer 706, the intermediate metal layer 708, and the top metal layer 710, as shown by the perspective view of transmission line 700 in FIG. 7A and the cross-sectional view of transmission line 700 in FIG. 7B. Slot 714 may reduce capacitance between the layers 706, 708, and 710, and may also be advantageous for design rule checking.

It is noted in the above embodiments, the transmission lines of FIGS. 5A-7B may be used for first and second transmission lines of a test structure which are co-linear and have the same width, as shown for example in FIGS. 1 and 4B. Furthermore, the first transmission line may be positioned only within a first dummy component and the second transmission line may be positioned only within a second dummy component. Yet further, the first transmission line may have a length 2 L and the second transmission line may have a length L. Yet further, a test pad may be electrically coupled to each end of the first transmission line and a test pad may be electrically coupled to each end of the second transmission line.

Advantageously, the transmission line of the present disclosure provide for reducing parasitic capacitance (e.g., through shunting capacitance of the junction between the doped well and the substrate) and parasitic inductance (e.g., through negative mutual inductance between the doped well and the substrate). The transmission line of the present disclosure also allows for accurate de-embedding results over 30 GHz, which has previously been problematic, as substrate resistance rises quickly at higher operating frequencies. In one example, the transmission lines of the present disclosure may be used for accurate de-embedding results at IC operating frequencies between about 50 GHz and about 60 GHz. Accordingly, the present disclosure may be advantageously applied to mm wave RF circuits and testkey applications. It is noted that the present disclosure may also be used for interconnects between circuit components.

Overall, the disclosed embodiments provide one or more of the following advantages: (1) in the preferred embodiment, only two transmission lines are required; (2) ABCD matrix components effectively solve all parasitics (e.g., resistance, inductance, and capacitance); (3) the layout size required by test structures is minimized (in the preferred embodiment, the test structure comprises only two dummy components); (4) model fitting to obtain the parasitics (or de-embedding parameters) is no longer required; (5) unlike the open-thru, open-short, and TRL de-embedding methods, an approximate open pad is not required for de-embedding purposes; (6) the proposed method is easy to use and the de-embedding results are essentially displayed right after experimental measurements are taken; and (7) the proposed method and system provides very good de-embedding accuracy, specifically when de-embedding parasitics contributed by test pads and transmission lines of a test structure.

In summary, a method and system are provided for de-embedding an on-wafer device. This method and system effectively determines the parasitics contributed by a test structure to measured characteristics of a DUT. Ultimately, this results in improved accuracy in determining intrinsic characteristics of a DUT.

In one embodiment, a wafer comprises at least one die comprising a plurality of devices; and at least one test structure for de-embedding at least one of the plurality of devices, wherein the at least one test structure further comprises: a first dummy component comprising a first transmission line; a second dummy component comprising a second transmission line, wherein the second dummy component is coupled with the first dummy component; and at least one test pad electrically connected to the first transmission line and at least one test pad electrically connected to the second transmission line. In some embodiments, the first dummy component and the second dummy component each further comprise at least one connecting line and at least one test pad electrically connected to the at least one connecting line.

In some embodiments, the second dummy component coupled with the first dummy component is further coupled with a device-under-test (DUT). In some embodiments, the first transmission line has length 2 L and the second transmission line has length L; and/or the first transmission line and the second transmission line are the same width. In some embodiments, the first transmission line and the second transmission line are on the same substrate. And, in some embodiments, the first transmission line and the second transmission line comprise conducting material.

In some embodiments, the at least one test pad electrically connected to the first transmission line comprises two signal test pads electrically connected to the first transmission line; and/or the at least one test pad electrically connected to the second transmission line comprises two signal test pads electrically connected to the second transmission line. In some embodiments, the at least one test pad electrically connected to the at least one connecting line comprises two ground test pads electrically connected to the at least one connecting line.

In one embodiment, a method for de-embedding an on-wafer device comprises representing the intrinsic characteristics of a test structure using a set of ABCD matrix components; determining the intrinsic characteristics arising from the test structure; and using the determined intrinsic characteristics of the test structure to produce a set of parameters representative of the intrinsic characteristics of a device-under-test ("DUT").

In some embodiments, representing the intrinsic characteristics of a test structure comprises representing intrinsic characteristics of a first dummy component and a second dummy component in ABCD matrix components, wherein the first dummy component and the second dummy component each comprise at least one test pad and at least one transmission line.

In some embodiments, determining the intrinsic characteristics arising from the test structure comprises determining the intrinsic characteristics arising from the at least one test pad of the first dummy component and the second dummy component; and determining the intrinsic characteristics arising from the at least one transmission line of the first dummy component and the second dummy component.

In some embodiments, determining the intrinsic characteristics arising from the at least one test pad comprises representing the intrinsic characteristics of the at least one test pad by matrix [PAD] in ABCD matrix components; and/or determining the intrinsic characteristics arising from the at least one transmission line comprises representing the intrinsic characteristics of the at least one transmission line by matrix [TLine] in ABCD matrix components, wherein [TLine] represents the intrinsic characteristics of a transmission line comprising length L.

In some embodiments, representing the intrinsic characteristics of the first dummy component and the second dummy component in ABCD matrix components comprises representing the intrinsic characteristics of the first dummy component by matrix [2 L], wherein [2 L]=[PAD][TLine][TLine][PAD] and the at least one transmission line of the first dummy component is two times longer than the at least one transmission line of the second dummy component; and representing the intrinsic characteristics of the second dummy component by matrix [L], wherein [L]=[PAD][TLine][PAD] and the at least one transmission line of the second dummy component comprises length L.

In some embodiments, determining the intrinsic characteristics arising from the at least one test pad further comprises manipulating matrices [2 L] and [L], wherein [PAD][PAD]=[[L]$^{-1}$[2 L][L]$^{-1}$]$^{-1}$; and/or determining the intrinsic characteristics arising from the at least one transmission line further comprises manipulating matrices [2 L] and [L], wherein [TLine]=[PAD]$^{-1}$[L][PAD]$^{-1}$.

In some embodiments, using the determined intrinsic characteristics of the test structure to produce a set of parameters representative of the intrinsic characteristics of a device-under-test ("DUT") comprises factoring out the determined intrinsic characteristics arising from the at least one test pad and the at least one transmission line of the first dummy component and the second dummy component from measured characteristics of the DUT.

In yet another embodiment, a test structure for de-embedding an on-wafer device comprises a first dummy component, wherein the first dummy component comprises a first transmission line of length L; a second dummy component coupled with the first dummy component, wherein the second dummy component comprises a second transmission line of length 2 L; and a device-under-test coupled with the first dummy component and/or the second dummy component.

In one embodiment, a transmission line is provided. The transmission line comprises a substrate, a well within the substrate, a shielding layer over the well, and a plurality of intermediate metal layers over the shielding layer, the plurality of intermediate metal layers coupled by a plurality of vias. The transmission line further includes a top metal layer over the plurality of intermediate metal layers.

In yet another embodiment, a test structure for de-embedding an on-wafer device is provided, the test structure comprising a first dummy component including a first transmission line; a second dummy component coupled with the first dummy component, wherein the second dummy component includes a second transmission line; and a device-under-test (DUT) electrically coupled with the first dummy component and/or the second dummy component, wherein the first transmission line and the second transmission line are each comprised of the transmission line as described above, wherein the well is a p-well or n-well.

In yet another embodiment, a wafer is provided, the wafer comprising at least one die comprising a plurality of devices; and at least one test structure for de-embedding at least one of the plurality of devices. The at least one test structure further comprises: a first dummy component including a first transmission line having a length 2 L; a second dummy component including a second transmission line having a length L, wherein the second dummy component is coupled with the first dummy component; and at least one test pad electrically coupled to the first transmission line and at least one test pad electrically coupled to the second transmission line, wherein the first transmission line and the second transmission line are each comprised of the transmission line as described above, wherein the well is a n-well.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. For example, it is noted that the present disclosure may also be used for interconnects between circuit components. In yet another example, n-type dopants may be switched with p-type dopants, n-type wells may be switched with p-type wells, and vice versa, in the embodiments described above. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
   a first component including a first ground line, a second ground line, and a first transmission line in parallel oriented in a first direction, wherein the first transmission line is disposed between the first and second ground lines,
   wherein the first ground line has a first line segment and a second line segment connected together, wherein the first line segment is oriented in the first direction and the second line segment is oriented in a second direction being orthogonal to the first direction, and
   a second component including a second transmission line, a third ground line, and a fourth ground line in parallel oriented in the first direction, coupled with the first component,
   wherein the first transmission line and the second transmission line are each comprised of:
   a substrate;
   a p-well or n-well within the substrate;
   a shielding layer over the p-well or n-well;
   a plurality of intermediate conducting layers over the shielding layer, the plurality of intermediate conducting layers vertically aligned with the p-well or n-well and coupled by a plurality of vias; and
   a top conducting layer over the plurality of intermediate conducting layers,
   wherein the second transmission line includes an elongated slot that is oriented in the first direction and extends through the shielding layer, the plurality of intermediate conducting layers, and the top conducting layer, wherein the shielding layer is a metal layer and directly contacts the P-well or N-well within the substrate.

2. The apparatus of claim 1, further comprising: a third component coupled with the second component, wherein the second component is disposed between the first and third components, and wherein the p-well or n-well, the shielding layer, the plurality of intermediate conducting layers, and the top conducting layer have a same width.

3. The apparatus of claim 1, wherein the first ground line further includes:
   a third line segment connected with the second line segment and oriented in the first direction;
   a fourth line segment connected with the first line segment and oriented in the second direction; and
   a fifth line segment connected with the fourth line segment and oriented in the first direction, wherein the third and fifth line segments are collinear.

4. The apparatus of claim 3, wherein the first line segment of the first ground line is spaced a first distance from the first transmission line; and the third and fifth segments of the first ground line are spaced a second distance from the first transmission line, wherein the first distance is less than the second distance.

5. The apparatus of claim 3, wherein the second ground line includes five line segments configured such that the first component is symmetric.

6. The apparatus of claim 1, wherein
the first transmission line is collinear with and is spaced a first distance from the second transmission line;
the first ground line is collinear with and is spaced the first distance from the third ground line; and
the second ground line is collinear with and is spaced the first distance from the fourth ground line.

7. The apparatus of claim 1, wherein the first transmission line has a length 2 L and the second transmission line has a length L.

8. The apparatus of claim 1, further comprising:
a test pad electrically connected to each end of the first transmission line and a test pad electrically connected to each end of the second transmission line; and
a ground pad electrically connected to each end of the first, second, third and fourth ground lines.

9. An apparatus comprising a plurality of devices and at least one structure for de-embedding, wherein the at least one structure comprises:
a first component including a first transmission line, a first ground line, and a second ground line, wherein the first transmission line is disposed between the first and second ground lines and spanned a length 2 L along a first direction;
a second component including a second transmission line, a third ground line, and a fourth ground line, wherein the second transmission line is disposed between the third and fourth ground lines and spanned a length L along the first direction,
wherein the second transmission line is collinear with and is spaced a first distance from the first transmission line, the third ground line is collinear with and is spaced a second distance from the first ground line, and the fourth ground line is collinear with and is spaced a third distance from the second ground line; and
a first pad electrically connected to the first transmission line and a second pad electrically connected to the second transmission line,
wherein the first transmission line and the second transmission line are each comprised of:
a substrate;
a n-well within the substrate;
a shielding layer over the n-well;
a plurality of intermediate metal layers over the shielding layer, the plurality of intermediate metal layers vertically aligned with the n-well and coupled by a plurality of vias; and a top metal layer over the plurality of intermediate metal layers,
wherein the second transmission line includes an elongated slot that is oriented along the first direction and expends through the shielding layer, the plurality of intermediate metal layers, and the top metal layer, wherein the shielding layer is a metal layer and directly contacts the P-well or N-well within the substrate.

10. The apparatus of claim 9, wherein the n-well, the shielding layer, the plurality of intermediate metal layers, and the top metal layer have the same width.

11. The apparatus of claim 9, wherein the second distance and the third distance are equal to the first distance.

12. The apparatus of claim 9, wherein the first ground line further includes:
a first line segment oriented in the first direction;
a second line segment connected with the first line segment and oriented in a second direction;
a third line segment connected with the second line segment and oriented in the first direction;
a fourth line segment connected with the first line segment and oriented in the second direction;
a fifth line segment connected with the fourth line segment and oriented in the first direction; and
a ground pad electrically connected with each end of the first ground line.

13. The apparatus of claim 9, wherein the second ground line includes five line segments configured such that the first component is symmetric.

14. An apparatus comprising:
a first transmission line disposed between a first ground line and a second ground line, and spanned a first length along a first direction; and
a second transmission line disposed between a third ground line and a fourth ground line, and spanned a second length along the first direction,
wherein the first and second transmission lines are collinear and spaced a first distance from each other, and each includes an elongated slot extending a length along the first direction, the first transmission line and the second transmission line including:
a substrate;
a well within the substrate;
a metal-containing shielding layer over the well and directly contacting the well; a plurality of intermediate metal layers over the shielding layer, the plurality of intermediate metal layers vertically aligned with the well coupled by a plurality of vias; and
a top metal layer over the plurality of intermediate metal layers, wherein the elongated slot extends through the shielding line, a plurality of intermediate metal layers, and the top metal layers.

15. The apparatus of claim 14, wherein the well, the shielding layer, the plurality of intermediate metal layers, and the top metal layer have the same width.

16. The apparatus of claim 14, wherein the first ground line further includes:
a first line segment oriented in the first direction;
a second line segment connected with the first line segment and oriented in a second direction;
a third line segment connected with the second line segment and oriented in the first direction;
a fourth line segment connected with the first line segment and oriented in the second direction; and
a fifth line segment connected with the fourth line segment and oriented in the first direction.

17. The apparatus of claim 16, wherein the first line segment of the first ground line is spaced a second distance from the first transmission line; and the third and fifth segments of the first ground line are spaced a third distance from the first transmission line, wherein the second distance is less than the third distance.

18. The apparatus of claim 14, wherein the first length is 2 L and the second length is L.

* * * * *